(12) United States Patent
Watson et al.

(10) Patent No.: US 8,461,479 B2
(45) Date of Patent: Jun. 11, 2013

(54) ADAPTIVE PROCESSING CONSTRAINTS FOR MEMORY REPAIR

(75) Inventors: Daniel J. Watson, Tigard, OR (US); Muir R. Cohen, Hood River, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 548 days.

(21) Appl. No.: 12/646,402

(22) Filed: Dec. 23, 2009

(65) Prior Publication Data

US 2011/0147348 A1 Jun. 23, 2011

(51) Int. Cl.
*B23K 26/00* (2006.01)

(52) U.S. Cl.
USPC ............ 219/121.62; 219/121.68; 219/121.69; 219/121.83

(58) Field of Classification Search
USPC .................. 219/121.62, 67, 68, 69, 72, 83, 85
See application file for complete search history.

(56) References Cited

U.S. PATENT DOCUMENTS

| 5,808,272 | A | * | 9/1998 | Sun et al. ................. 219/121.68 |
| 2002/0166845 | A1 | * | 11/2002 | Cordingley et al. ..... 219/121.62 |
| 2003/0105547 | A1 | | 6/2003 | Haight et al. |
| 2004/0031779 | A1 | * | 2/2004 | Cahill et al. ............. 219/121.83 |
| 2005/0282406 | A1 | | 12/2005 | Bruland et al. |
| 2006/0006156 | A1 | | 1/2006 | Huonker et al. |
| 2006/0054608 | A1 | * | 3/2006 | Cahill et al. ............. 219/121.83 |
| 2008/0284837 | A1 | | 11/2008 | Cordingley et al. |
| 2008/0314879 | A1 | * | 12/2008 | Bruland et al. .......... 219/121.62 |

* cited by examiner

*Primary Examiner* — Minh-Loan T Tran
*Assistant Examiner* — Fazli Erdem
(74) *Attorney, Agent, or Firm* — Young Basile

(57) ABSTRACT

An apparatus and method for processing a plurality of semiconductor parts in a laser-based system adjusts a default recipe to account for work to be performed on at least one part of the plurality of parts. The work to be performed on a part is analyzed using the default recipe and a part-specific recipe including a modified parameter of the default recipe. The default or part-specific recipe is selected based on a desired processing result, and the selected recipe replaces the default recipe to perform the work using the laser-based system.

15 Claims, 12 Drawing Sheets

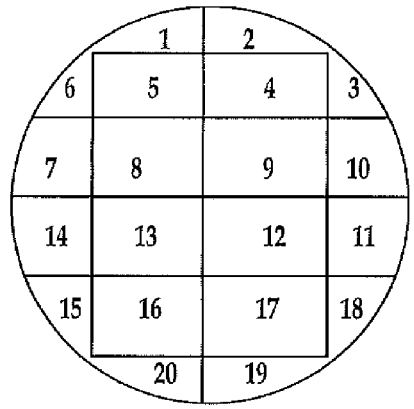
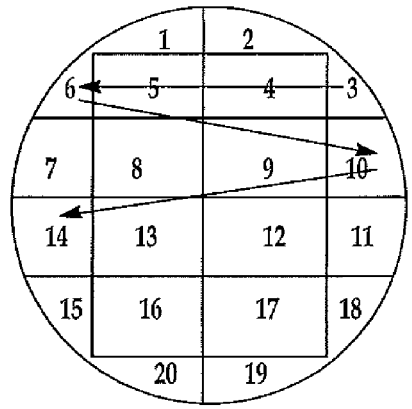
FIG. 12        FIG. 13
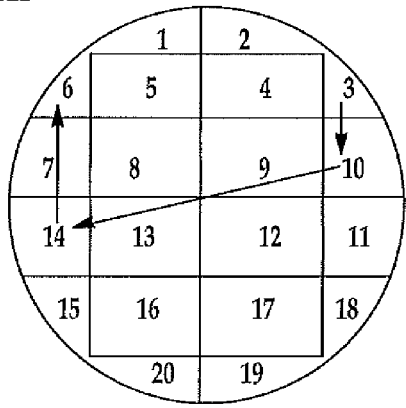
FIG. 14
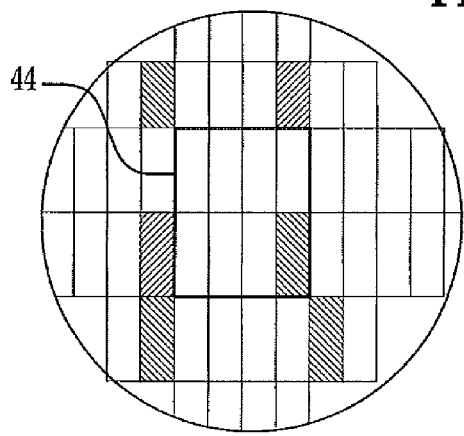
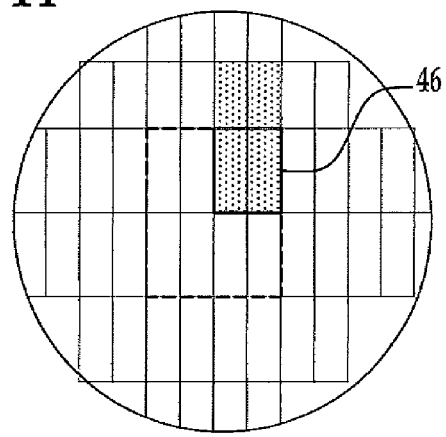
FIG. 15        FIG. 16

ADAPTIVE PROCESSING CONSTRAINTS FOR MEMORY REPAIR

TECHNICAL FIELD

This disclosure relates generally to the use of laser beams to process structures on or within a semiconductor integrated circuit.

BACKGROUND

Laser-based semiconductor processing systems are generally used, for example, to drill, machine, trim, sever, scribe, mark, cleave, make, heat, alter, diffuse, anneal, and/or measure a structure or its material on or within a semiconductor substrate. To improve throughput during fabrication of integrated circuits (ICs), it is also generally desirable that laser-based processing systems accurately and quickly process selected structures on or within the semiconductor substrate. However, conventional laser-based processing systems are typically tuned and operated with a conservative set of parameters to provide good accuracy for all types of ICs intended to be processed by the system. This "one-size-fits-all" approach often results in reduced processing speeds and overall reduced throughput.

A semiconductor link processing system, for example, typically provides the same level of accuracy when severing links on any IC. During fabrication, ICs often incur defects for various reasons. For that reason, IC devices are usually designed to include redundant circuit elements, such as spare rows and columns of memory cells in semiconductor memory devices, e.g., a dynamic random access memory (DRAM), a static random access memory (SRAM), or an embedded memory. Such devices are also designed to include particular laser-severable links between electrical contacts of the redundant circuit elements. Such links can be removed, for example, to disconnect a defective memory cell and to substitute a replacement redundant cell. Links may also be removed for identification, configuration and voltage adjustment. Similar techniques are also used to sever links in order to program or configure logic products, such as gate arrays or application-specific integrated circuits (ASICs). After an IC has been fabricated, its circuit elements are tested for defects, and the locations of defects may be recorded in a database. Combined with positional information regarding the layout of the IC and the location of its circuit elements, a laser-based link processing system can be employed to remove selected links so as to make the IC useful.

Laser-severable links are typically about 0.5 to 1 microns (µm) thick, about 0.5 to 1 µm wide, and about 8 µm in length. Circuit elements in an IC, and thus links between those elements, are typically arranged in a regular geometric arrangement, such as in regular rows. In a typical row of links, the center-to-center pitch between adjacent links is about 2 to 3 µm. These dimensions are representative, and are declining as technological advances allow for the fabrication of workpieces with smaller features and the creation of laser processing systems with greater accuracy and smaller focused laser beam spots. Although the most prevalent link materials have been polysilicon and like compositions, memory manufacturers have more recently adopted a variety of more electrically conductive metallic link materials that may include, but are not limited to, aluminum, copper, gold nickel, titanium, tungsten, platinum, as well as other metals, metal alloys, metal nitrides such as titanium or tantalum nitride, metal silicides such as tungsten silicide, or other metal-like materials.

Conventional laser-based semiconductor link processing systems focus a single pulse of laser output having a pulse width of about 4 to 30 nanoseconds (ns) at each link. The laser beam is incident upon the IC with a footprint or spot size large enough to remove one and only one link at a time. When a laser pulse impinges a polysilicon or metal link positioned above a silicon substrate and between component layers of a passivation layer stack including an overlying passivation layer, which is typically 2000-10,000 angstroms (Å) thick, and an underlying passivation layer, the silicon substrate absorbs a relatively small proportional quantity of infrared (IR) radiation and the passivation layers (silicon dioxide or silicon nitride) are relatively transparent to IR radiation. IR and visible laser wavelengths (e.g., 0.532 µm, 1.047 µm, 1.064 µm, 1.321 µm, and 1.34 µm) have been employed for more than 20 years to remove circuit links.

Many conventional semiconductor link processing systems employ a single laser pulse focused into a small spot for link removal. Banks of links to be removed are typically arranged on the wafer in a straight row, an illustrative one of which is shown in FIG. 20. The row need not be perfectly straight, although typically it is quite straight. The links are processed by the system in a link run 120, which is also referred to as an on-the-fly ("OTF") run. During a link run, the laser beam is pulsed as a stage positioner passes the row of links across the location of a focused laser spot 110. The stage typically moves along a single axis at a time and does not stop at each link position. Thus, the link run is a processing pass down a row of links in a generally lengthwise direction (e.g., horizontally across the page as shown). Moreover, the lengthwise direction of link run 120 need not be exactly perpendicular to the lengthwise direction of the individual links that constitute the row, although that is typically true.

Impinging on selected links in link run 120 is a laser beam whose propagation path is along an axis. The position at which that axis intersects the workpiece continually advances along link run 120 while pulsing the laser to selectively remove links. The laser is triggered to emit a pulse and sever a link when the wafer and optical components have a relative position such that the pulse energy impinges upon the link (e.g., trigger position 130). Some of the links are not irradiated and left as unprocessed links 140, while others are irradiated to become severed links 150.

FIG. 21 illustrates a typical link processing system that adjusts the position of the spot 110 by moving a wafer 240 in an X-Y plane underneath a stationary optics table 210. Optics table 210 supports a laser 220, a mirror 225, a focusing lens 230, and possibly other optical hardware. Wafer 240 is moved underneath in the X-Y plane by placing it on a chuck 250 that is carried by a motion stage 260.

FIG. 22 depicts the processing of wafer 240. A conventional sequential link blowing process requires scanning X-Y motion stage 260 across wafer 240 once for each link run. Repeatedly scanning back and forth across wafer 240 results in complete wafer processing. A machine typically scans back and forth processing all X-axis link runs 310 (shown with solid lines) before processing Y-axis link runs 320 (shown in dashed lines). This example is merely illustrative. Other configurations of link runs and processing modalities are possible. For example, it is possible to process links by moving the wafer or optics rail. In addition, link banks and link runs may not be processed with continuous motion.

For a wafer 240 comprising DRAM, for example, memory cells (not shown) may be located in areas 322 between X-axis link runs 310 and Y-axis link runs 320. For illustrative purposes, a portion of wafer 240 near an intersection of an X-axis link run 310 and a Y-axis link run 320 is magnified to illustrate a plurality of links 324 arranged in groups or link banks. Generally, the link banks are near the center of a die, near decoder circuitry, and not above any of the array of memory cells. Links 324 cover a relatively small area of the total wafer 240.

System parameters that may impact the time spent executing link runs, and thus throughput, include the laser pulse repetition frequency (PRF) and motion stage parameters such as stage acceleration, bandwidth, settling time, and the commanded stage trajectory. The commanded stage trajectory includes acceleration and deceleration segments, constant velocity processing of link banks, and "gap profiling" or accelerating over large gaps between links to be processed in a link run.

These and other system parameters may change between semiconductor wafers, between different types of semiconductor wafers, and/or with time. However, conventional semiconductor link processing systems typically use predetermined hardware configurations and motion profiling parameters, regardless of the differences between semiconductor wafers and/or system characteristics that change with time. Thus, processing accuracy may exceed expected or desired levels at the cost of reduced throughput for some semiconductor wafers.

BRIEF SUMMARY

Embodiments of a method for processing a plurality of semiconductor parts in a laser-based system are taught herein. One such method comprises analyzing work to be performed by the laser to a part of the plurality of semiconductor parts using a default recipe to obtain a default processing result of processing the part using the default recipe and before the part, the default recipe including a group of parameters for processing the plurality of semiconductor parts, modifying a parameter of the default recipe to create a part-specific recipe associated with the parameter, analyzing the work to be performed by the laser to the part using the part-specific recipe to obtain an alternative processing result of processing the part using the part-specific recipe and before processing the part, selecting one of the default recipe and the part-specific recipe for processing the part based on which of the default processing result and the alternative processing result is closest to a desired processing result and performing the work to be performed to the part using the selected recipe in the laser-based system.

Embodiments of an apparatus for processing a plurality of semiconductor parts in a laser-based system are also taught.

Details and variations in these and other embodiments of the invention will be apparent from the following drawings and detailed description.

BRIEF DESCRIPTION OF THE DRAWINGS

The description herein makes reference to the accompanying drawings wherein like reference numerals refer to like parts throughout the several views and wherein:

FIG. 12 is a plan view of a possible layout of 20 processing fields in a processing order according to a default recipe;

FIG. 13 is a plan view of the order in which the system would processing fields when there is work to be performed in only some of the processing fields;

FIG. 14 is a plan view of an alternate order in which the system would process the fields with work to be performed as in FIG. 13 according to an embodiment of the invention;

FIG. 15 is a plan view of a layout of alignment fields for one wafer illustrating a reference field;

FIG. 16 is a plan view of the layout of alignment fields as in FIG. 15 for another wafer showing a modified reference field based on the work to be performed on the wafer;

DETAILED DESCRIPTION OF EMBODIMENTS OF THE INVENTION

Figure 1:
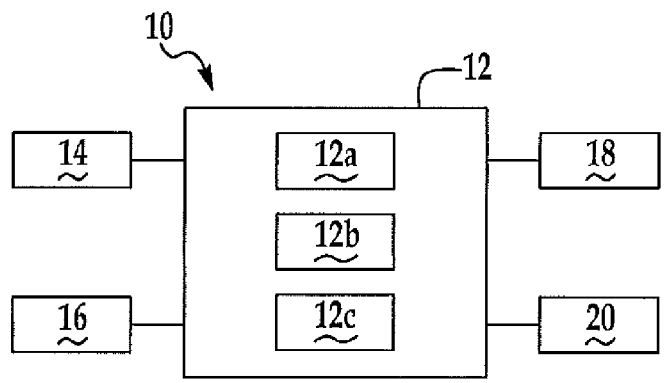
FIG. 1 is a schematic diagram illustrating an apparatus in which embodiments of the invention can be incorporated.

Certain embodiments of the invention are described hereinafter with reference to the drawing figures, including their detailed construction and operation. The principles, methods, and systems disclosed below have general applicability for processing any structure on or within a semiconductor substrate using laser radiation for any purpose. While the examples and embodiments that follow are described in the context in which those structures are laser-severable links on or within an IC (e.g., memory device, logic device, optical or optoelectronic device including LEDs, and microwave or RF devices), other structures besides laser-severable links can be processed in the same or similar manner. Thus, the teachings set forth herein are equally applicable to the laser processing of other types of structures, such as electrical structures that become conductive as a result of laser radiation, other electrical structures, optical or electro-optical structures, and mechanical or electro-mechanical structures (e.g., micro electromechanical structures (MEMS) or micro opto-electromechanical structures (MOEMS)).

The purpose of the irradiation may be to sever, cleave, make, heat, alter, diffuse, anneal or measure a structure or its material. For example, laser radiation can induce a state change in a structure's material, cause the migration of dopants, or alter magnetic properties—any of which could be used to connect, disconnect, tune, modify or repair electrical circuitry or other structures.

Figure 23:
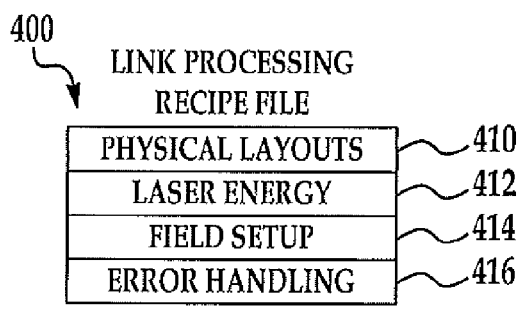
FIG. 23 is a block diagram of a data structure for a conventional link processing recipe file.

Link processing systems generally include "recipes" that describe how wafers are to be processed. For example, FIG. 23 is a block diagram of a data structure for a conventional link processing recipe file 400. The conventional link processing recipe file 400 generally includes physical layout parameters 410, laser energy parameters 412, field setup parameters 414 and error handling parameters 416.

Physical layout parameters 410 may specify physical dimensions of a wafer such as die size and locations of alignment targets. Laser energy parameters 412 may specify a first laser energy to use for scanning alignment targets and a second laser energy to use for processing links. Field setup parameters 414 may specify targets, target timeouts, and respective target shapes in alignment fields, focus fields, and processing fields. Alignment fields include calibration data for X-Y direction alignment of the laser to the part or workpiece. Focus fields include calibration data for Z direction alignment of the laser to the workpiece. Processing fields, which are typically much larger than alignment fields, define the field sizes for processing link runs. For example, a 300 mm wafer may be processed using four to six processing fields. However, one to three processing fields or more than six processing fields may also be used. A link run, which may be as long as the X or Y dimension of the alignment field, may span multiple alignment/focus fields. Error handling parameters 416 may specify, for example, recovery mechanisms when poor quality scans are detected and "target timeout times" that specify a maximum duration for which the system will use data gathered during an alignment scan (sometimes referred to herein as a beam-to-work (BTW) scan). Error handling parameters 416 may also include, for example, target scan positioning tolerances.

In order to process material on a semiconductor link processing system, the user must specify certain parameters to describe the material they wish to repair and also parameters that govern the processing of the semiconductor substrate (e.g. a wafer). One example of this is that the user must specify the orientation of wafer 240 (0, 90, 180, or 270 degrees) to be placed on processing chuck 250. This is generally one of physical layout parameters 410. Further, the alignment fields were mentioned above and are also described by the user. Each alignment field specifies the set of alignment targets whose positions will be verified during the processing of that section of the wafer that is correlated to the alignment field as described in more detail hereinafter.

The work to be performed for each wafer 240 must also be specified, but it is often different from wafer to wafer. This occurs even when wafers are manufactured at the same facility and according to the same processes due to contamination and other unpredictable manufacturing defects. Herein, work to be performed for each wafer 240 specified by the user is generally called repair data for convenience, but such work to be performed is not limited thereto.

Wafers 240 are generally processed in groups in a cassette or tray using the same link processing recipe file 400, hereinafter referred to as default recipe 400. Because the repair data is different, there may be no single default recipe 400 that is best for all possible (or actual) sets of repair data. Embodiments of the invention, however, provide a method and apparatus that can increase throughput by modifying the existing default recipe 400 based on the repair data. The strategies organizing the work to be performed are altered, but parameters that actually impact the results of processing, such as spot size, energy, etc., are not. Therefore, the speed of processing can be improved without degrading the actual work that is performed.

Various modifications can be made to default recipe 400 in order to provide an alternative recipe per wafer or per set of work to be performed. All parameters that specify processing strategies, such as the position of alignment fields on a wafer, the orientation of the wafer on chuck; the placement of alignment, focus and processing fields, the order in which processing fields are processed, the position of video alignment targets, etc., can possibly be chosen on a per-wafer (or per-set-of-work-to-be-done) basis in order to optimize processing compared to any one setting for these parameters.

Embodiments of the invention rely on analyzing the work to be done with reference to both a default recipe and to the machine on which the work will be done. One exemplary way of performing this analysis is described with reference to FIGS. 1 and 2.

Embodiments of the invention can be implemented in a computer 10, for example, as shown schematically in FIG. 1. Computer 10 includes a central processing unit (CPU) 12, one or more input devices or connections 14, memory 16 such as random access memory (RAM) and a read-only memory (ROM), etc., one or more output connections 18 and a display 20. While computer 10 is shown as a stand-alone computer, functions of the computer 10 and its CPU 12, along with peripheral devices such as display 20, can be incorporated into a dedicated computer or controller for the link processing system of FIG. 18.

CPU 12 includes a plurality of processing parts whose functions are described with reference to FIG. 2. As shown in FIG. 1, the processing parts comprise a simulation part 12a, a parameter adjusting part 12b and a recipe determination part 12c. As is known, processing of arithmetic and logic operations (that is, control) performed by computer 10 generally conforms to a set of computer executable instructions (e.g., software) stored on a computer readable medium. For example, the parts described herein represent functional components of one or more software programs stored in memory 16 and executed by CPU 12. Of course, some or all of the functions described herein can be alternatively implemented by hardware components.

Figure 2:
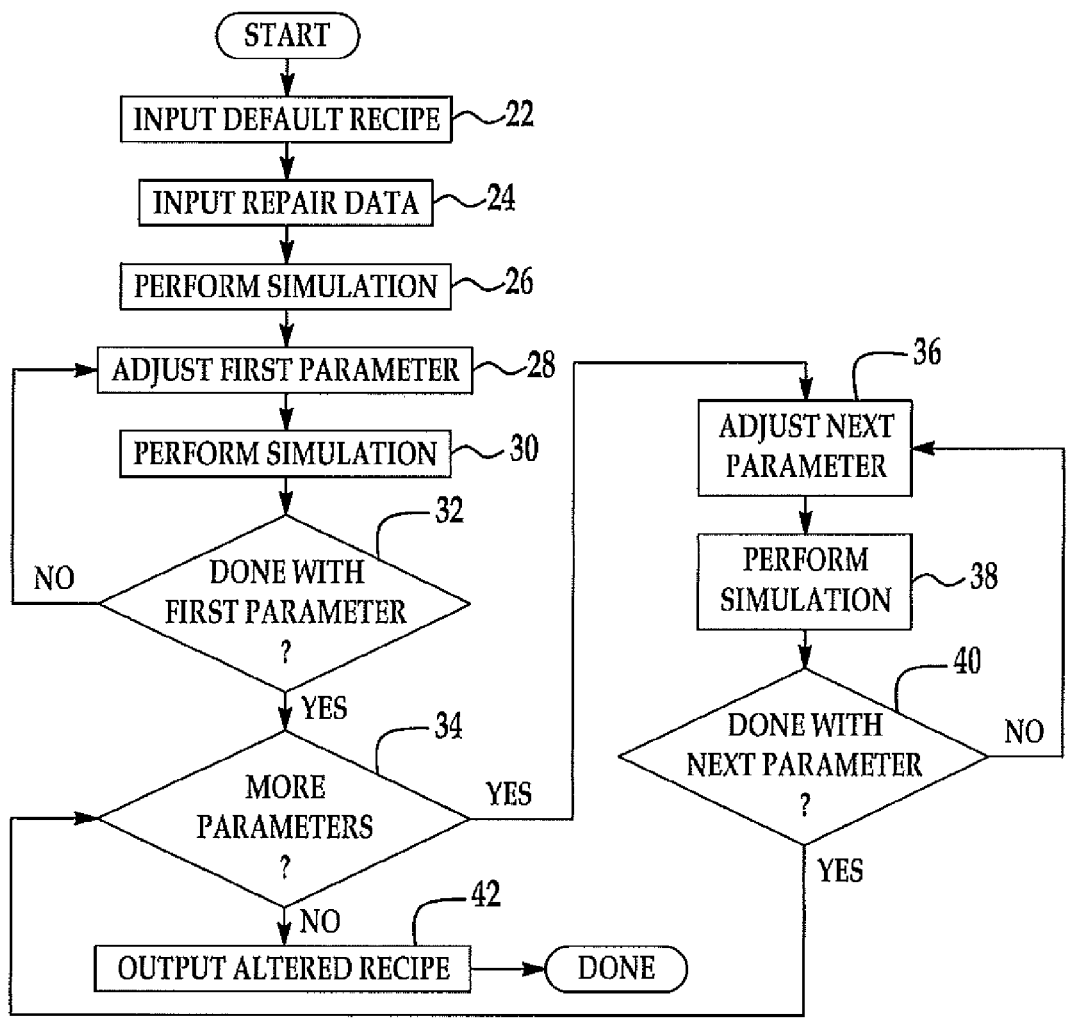
FIG. 2 is a flowchart illustrating a method for modifying the conventional link processing recipe file of FIG. 20 based on the work to be performed on a plurality of semiconductor wafers according to one embodiment of the invention.
Figure 21:
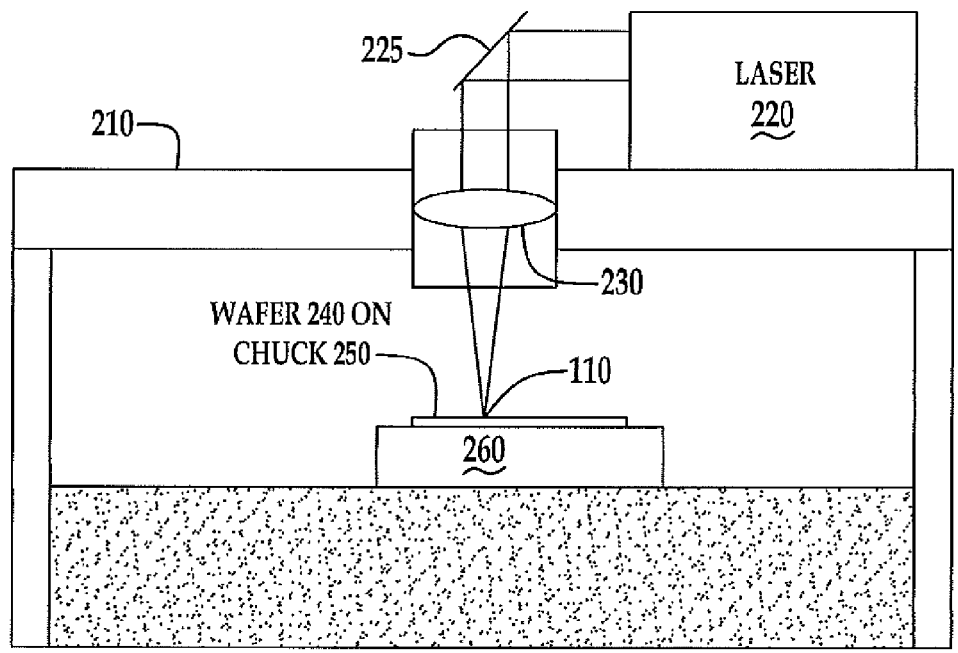
FIG. 21 is a schematic diagram of a prior art link processing system.
Figure 22:
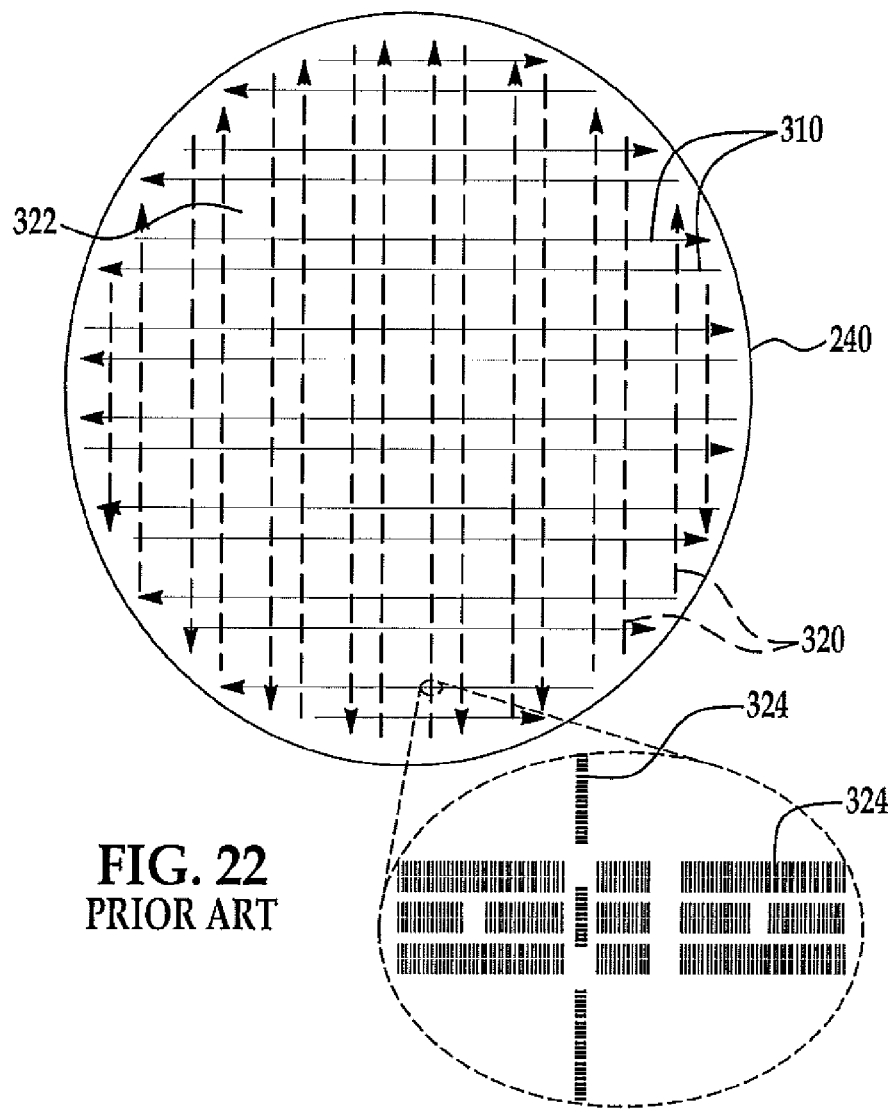
FIG. 22 is a schematic diagram of a prior art semiconductor wafer including a plurality of link runs.

FIG. 2 shows a method for altering default recipe 400, where appropriate, to improve processing performance for one or more wafers based on the work to be performed thereto. At step 22, default recipe 400 is input to CPU 12 through input connection 14. For example, input connection 14 could be a keyboard into which data is manually entered related to default recipe 400. Alternatively, input connection 14 could be a connection for a storage device, portable or otherwise, that allows CPU 12 to upload default recipe 400 in the form of a database, parameter file, source code, a set of computer executable instructions, etc. Input connection 14 could also be a connection, serial or otherwise, to another device on which default recipe 400 is stored, such as the computer for the link processing system of FIG. 21. Default recipe 400 would include, in addition to parameters related to the laser and other components of the link processing system, parameters related to the wafers. These parameters regulate a lot of wafers to be processed and include the position of alignment fields on a wafer, the orientation of the wafer on chuck, the placement of alignment, focus and processing fields, the order in which processing fields are processed, the position of video alignment targets and others known to those skilled in the art. This data can be specified by the manufacturer of the wafers and/or can be set by the user of the link processing system based on previous experience with wafer processing.

Figure 20:
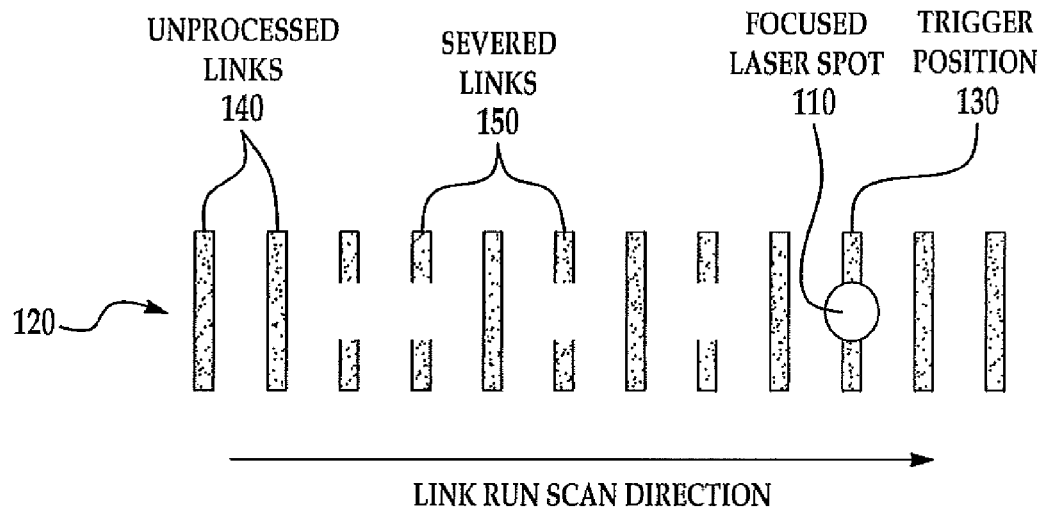
FIG. 20 is a schematic diagram illustrating a prior art row or bank of links being selectively irradiated with a laser spot scanning along a lengthwise direction of the bank.

At step 24, work to be performed on the wafer or a set of wafers is input. As described above, the work to be performed can be, for example, repair data to memory on or within the wafers. This data can be specified by the manufacturer of the wafers and would include an address at which each action by the laser is to take place, along with the action. It can also be obtained as a result of an earlier processing step, such as a memory test. For example, repair data could include which links are to be severed by location (e.g., in X- and Y-coordinates) as described with reference to FIG. 20.

Once both default recipe 400 and the work to be performed is input, a wafer throughput simulation can be performed in step 26 by simulation part 12a. Wafer throughput simulation is a software modeling technique known in the art to evaluate processing time based on particular settings of various system constraints for a given link processing system. By changing the parameters of interest here, the effects on processing time of the changes could be assessed using such a simulation. An exhaustive strategy that evaluates combinations of values for the various constraints is possible. However, in practice such an analysis could be slow enough to jeopardize the value of the results. Therefore, FIG. 2 describes generally a sequential analysis of one or more parameters, but the invention is not limited to such an analysis as described hereinafter.

The simulation performed in step 26 would provide a processing time for default recipe 400 given the specified work to be performed for a wafer 240. The parameters of the simulation and the resulting processing time can be displayed on display 20, but this is not required. After step 26, adjustment of parameters by parameter adjusting part 12b begins in step 28 with the adjustment of a first parameter and continues to step 30 for a new simulation using the altered parameter with the other values of default recipe 400 unchanged. This new simulation in step 30 results in a new processing time associated with the altered parameter. This process repeats until the desired adjustments to the first parameters are all simulated to obtain respective processing times in response to the query of step 32. Then, optionally, a query next occurs in step 34 to assess whether additional parameters should be analyzed.

If there is another parameter to assess, that parameter is adjusted in step 36, and the simulation is performed with the altered parameter in step 38 to obtain a new processing time. This process repeats until the desired adjustments to this next parameter are all simulated to obtain respective processing times in response to the query of step 40. Then, optionally, the query in step 34 is repeated to assess whether additional parameters should be analyzed. The effects on processing each of the parameters can be analyzed according to this process by group of wafers, or on a wafer by wafer basis. The parameters can also be modified to simulate the performance of a subset of a wafer as described in an embodiment hereinafter.

When all of the parameters are simulated, as indicated by a negative response to the query in step 34, an altered recipe can be output by recipe determination part 12c in step 42. For example, recipe determination part 12c could select the parameter values that result in the lowest overall processing time. The altered recipe could then be supplied to output connection 18. Output connection 18 could be, for example, a connection for a storage device, portable or otherwise, that allows CPU 12 to download the altered recipe in the form of a database, parameter file, source code, a set of computer executable instructions, etc. Output connection 18 could also be, like input connection 14, a connection, serial or otherwise, to another device in which the altered recipe will be used, such as the computer for the link processing system of FIG. 21. When the functions of computer 10 are incorporated into operating system for the link processing system of FIG. 21, the input connection 14 and/or output connection 18 represent a communication channel between processes in the operating system.

Alternatively, instead of the computer 10 selecting the altered parameter(s) to use for the altered recipe, the user could review the results and determine which parameters are desirably changed. These selections could then be implemented by the user by altering default recipe 400 by hand or otherwise creating the altered recipe using default recipe 400 as a starting point.

The altered recipe replaces the default recipe. The altered recipe includes a part-specific recipe, where a part-specific recipe is the default recipe modified by at least one parameter based on the work to be performed on the semiconductor part, by example a wafer. In certain embodiments, the altered recipe can be a single recipe for a group of wafers analyzed together. This is not likely to provide as much benefit as analyzing wafers individually since combining the repair data for multiple wafers tends to obscure any wafer-by-wafer variation in repair data. However, this may be beneficial in cases where simulation is slow and/or expensive relative to the actual processing of the part. In other embodiments, the altered recipe can be a recipe combining part-specific recipes for all wafers in a group of wafers to be processed. Various ways of combining the part-specific recipes are within the scope of knowledge of one skilled in the art provided with the teachings herein. For example, if a set of 20 wafers is analyzed with respect to orientation based on their respective repair data, and a change in orientation by 90 degrees is desirable in the majority of those wafers, the altered recipe could include the change in orientation by 90 degrees. In such cases, it may be desirable to analyze the group of wafers using the altered recipe with its changed parameter or parameters to assure that the benefits obtained using the altered recipe for certain of the wafers are not outweighed by any reductions in the benefits to others. Herein, a part-specific recipe is also called a wafer-specific recipe.

Although FIG. 2 shows a sequential selection of parameters through altering and testing one parameter at a time, this is only an example and may not provide the best results because FIG. 2 assumes that optimizing each of the parameters being analyzed will result in the best overall time. An additional step can be included that would run a simulation including parameter values that obtained the best individual results to determine whether adjusting any one of the parameters to create the altered recipe would be better than changing all of them to create the altered recipe. An iterative process can also be implemented wherein several adjustments for a first parameter could be used in simulations with one or more adjustments to a second parameter to assess the relationship between the first and second parameters with respect to processing time given the work to be performed. Then, the first and second parameters could be adjusted based on the relationship found and analyzed with another simulation.

The invention is not limited to any particular algorithm for choosing values for the various parameters because the best strategy or strategies for choosing values for the various parameters will in general vary according to the nature of the machine behavior that is being specified and/or constrained.

For this reason, simulation using known techniques as described above is not necessary to analyze the affects of various parameters based on the work to be performed. One example where simulation may not be used when analyzing a change in parameter based on the work to be performed occurs if a system is in general capable of higher throughput in the X-axis than in the Y-axis. In this case, the angle of placement of each wafer 240 on chuck 250 might simply be selected to maximize the amount of work to be performed in the axis with the higher throughput axis without simulations. Accordingly, the teachings of the invention of changing one or more parameters for processing a wafer or a plurality of wafers based on the work to be performed on the wafer(s) can be implemented using rule based decisions or parameters, modeling, prediction, characterizations of the system or system component behavior, wafer properties, accuracy budgeting, artificial intelligence, fuzzy logic, neural networks, cost function minimization, or other algorithmic implementation or methodology.

Certain specific examples are illustrative of ways in which embodiments of the invention can be implemented.

Figure 3:
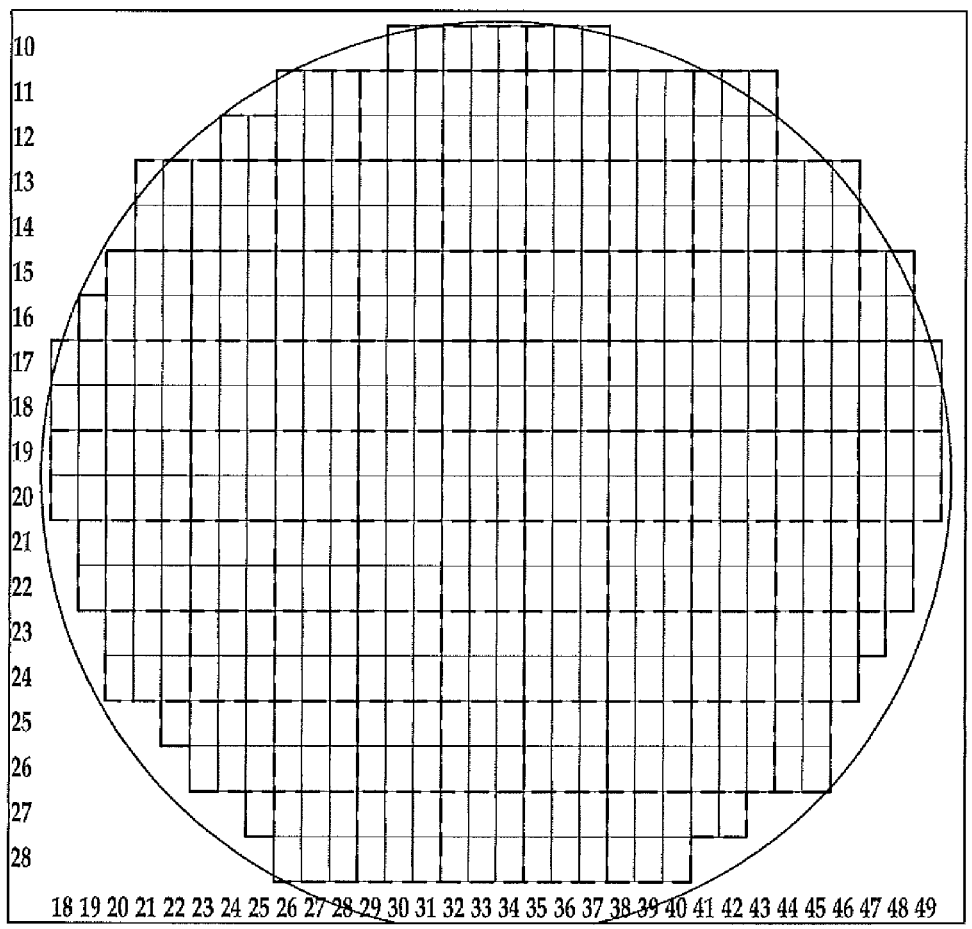
FIG. 3 is a plan view of a default layout of alignment fields for a hypothetical wafer design.
Figure 4:
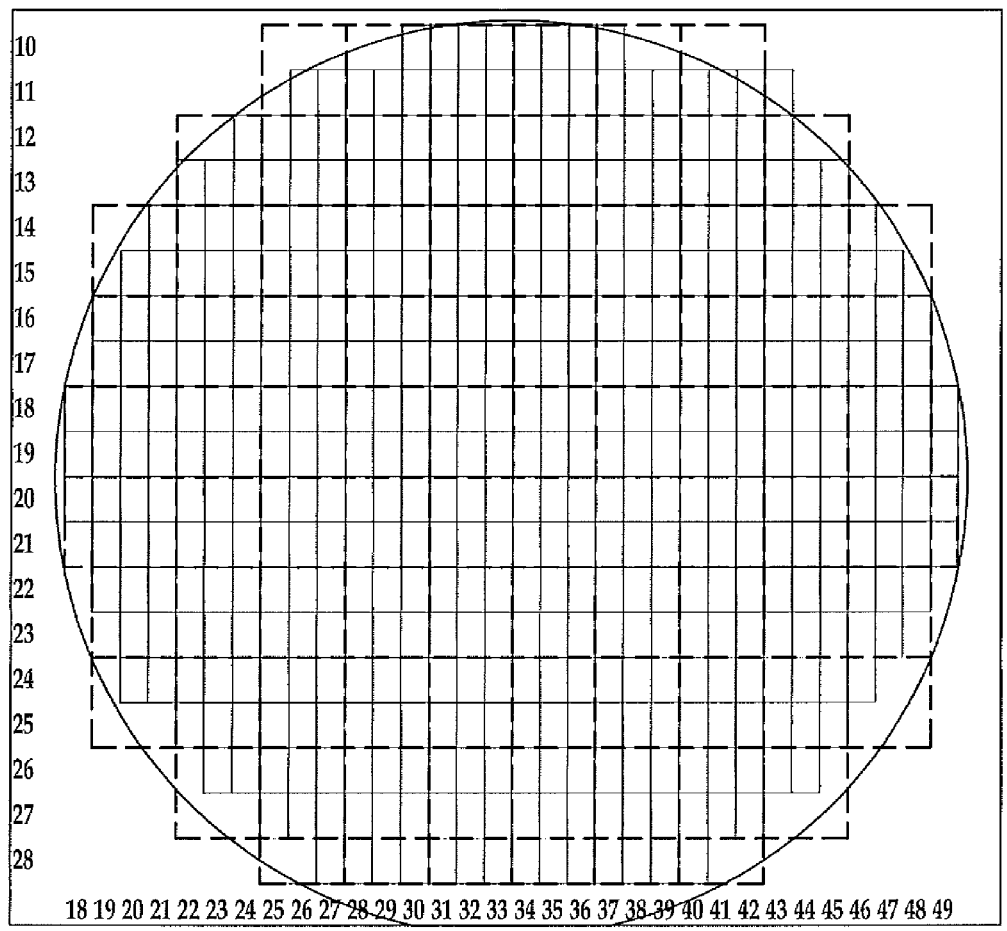
FIG. 4 is a plan view of an alternative layout of alignment fields for a hypothetical wafer design.

Examples of an embodiment of the invention where alignment fields are modified based on the work to be performed are described with reference to FIGS. 3 to 11. In the examples of FIGS. 3 to 10, alignment fields are varied in a rectangular tiling pattern across the wafer shifted by one row or column. That is, FIG. 3 shows a default layout of alignment fields for a hypothetical wafer design, while FIG. 4 shows, for comparison, an alternative layout of alignment fields where the default layout of FIG. 3 is displaced by one column and one row. In FIGS. 3 and 4, the solid lines indicate die boundaries, while the dashed lines indicate the borders of the alignment fields. The numbers on the X- and Y-axes are row and column markers, respectively.

Figure 5:
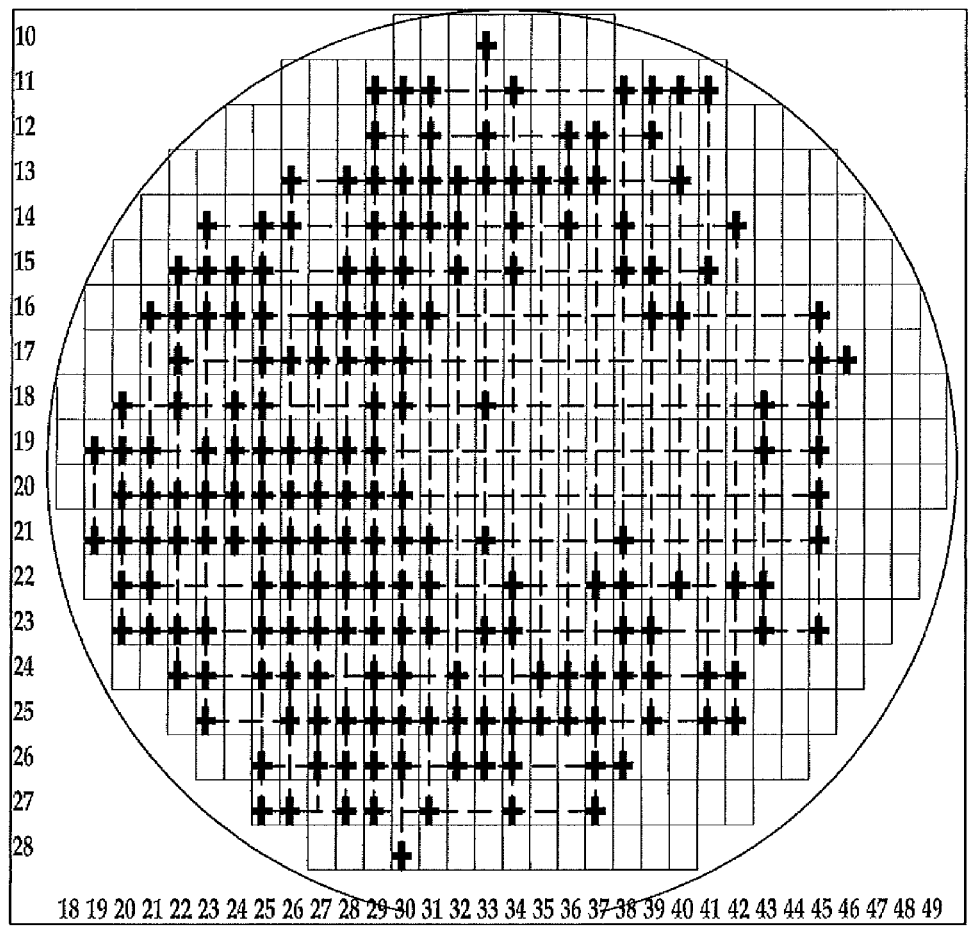
FIG. 5 is a plan view of a first example set of repair data shown in relation to die boundaries of a wafer.
Figure 6:
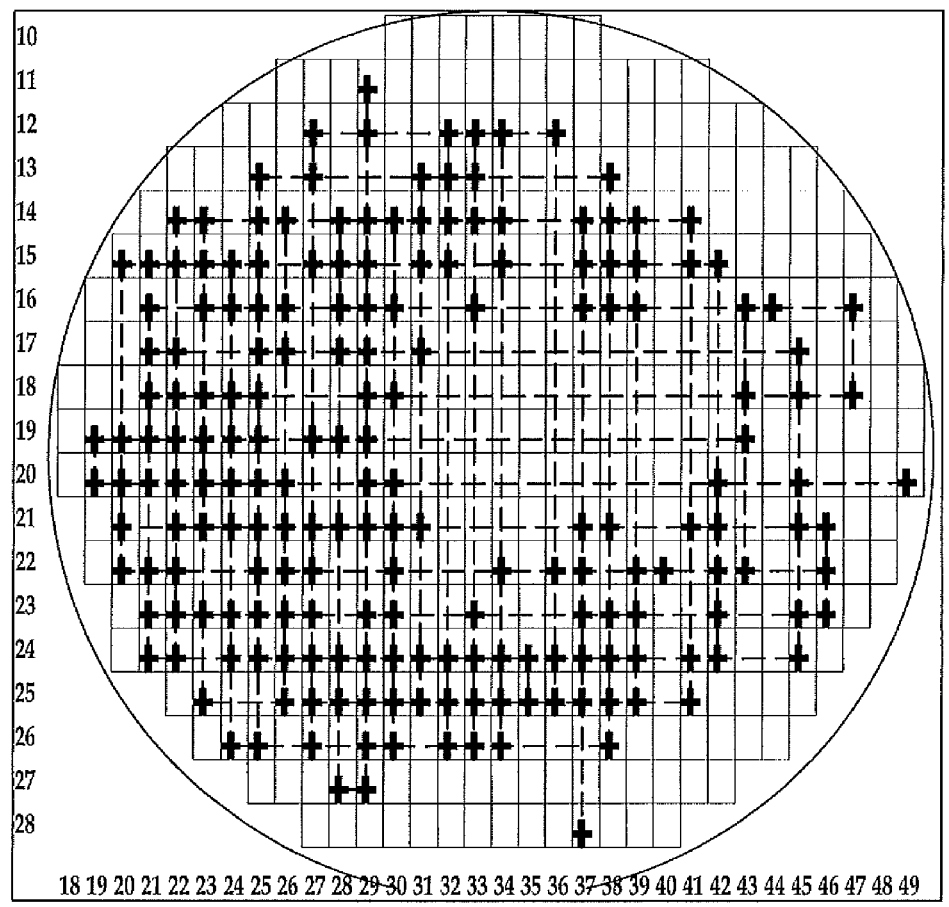
FIG. 6 is a plan view of a second example set of repair data shown in relation to die boundaries of a wafer.
Figure 7:
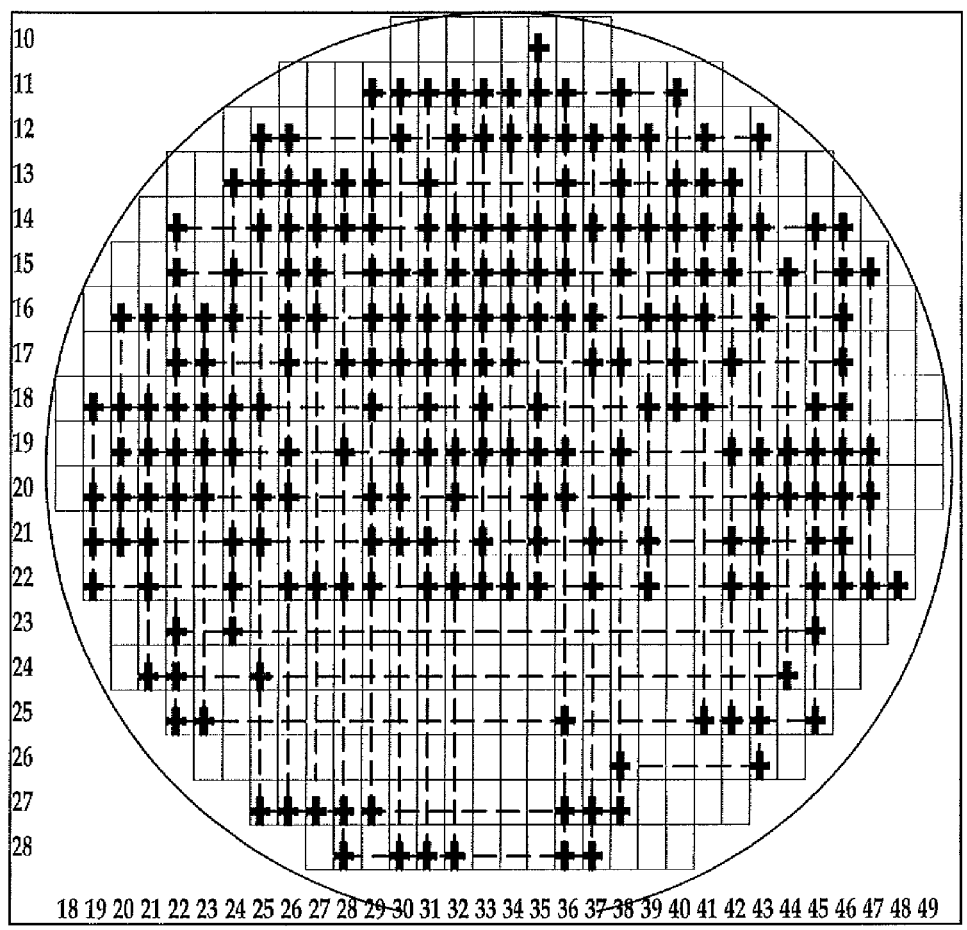
FIG. 7 is a plan view of a third example set of repair data shown in relation to die boundaries of a wafer.

FIGS. 5, 6 and 7 are three examples of representative sets of repair data to process with a recipe. As in FIGS. 3 and 4, solid lines indicate die boundaries, and the numbers on the X- and Y-axes are row and column markers. Dies with work to be done are shown with "+" signs, and dies without work to be done are shown either as empty or with one or two lighter lines.

Figure 8:
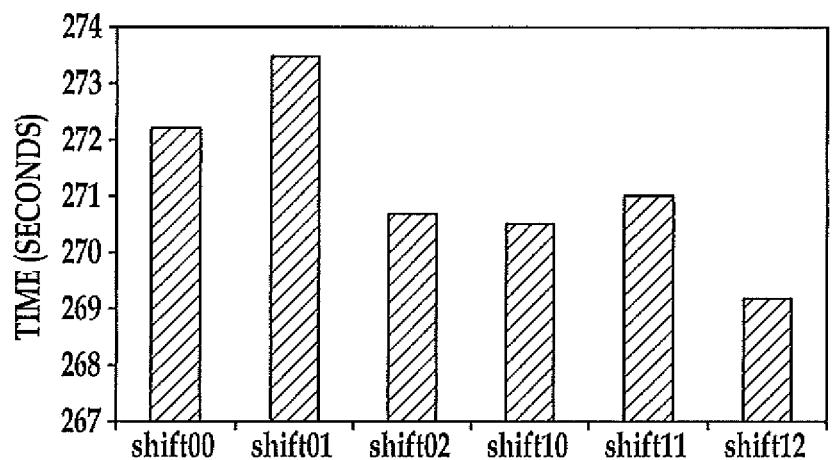
FIG. 8 is a graph illustrating the time for processing the repair data of FIG. 5 using a variety of layouts for alignment fields.
Figure 9:
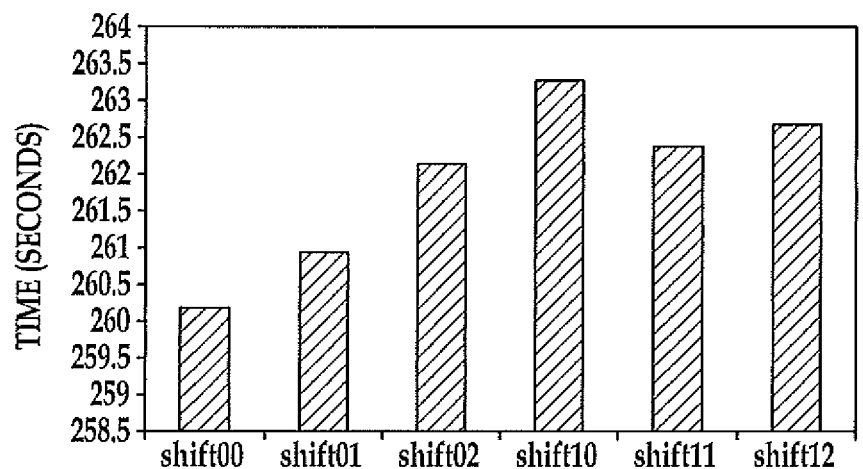
FIG. 9 is a graph illustrating the time for processing the repair data of FIG. 6 using a variety of layouts for alignment fields.
Figure 10:
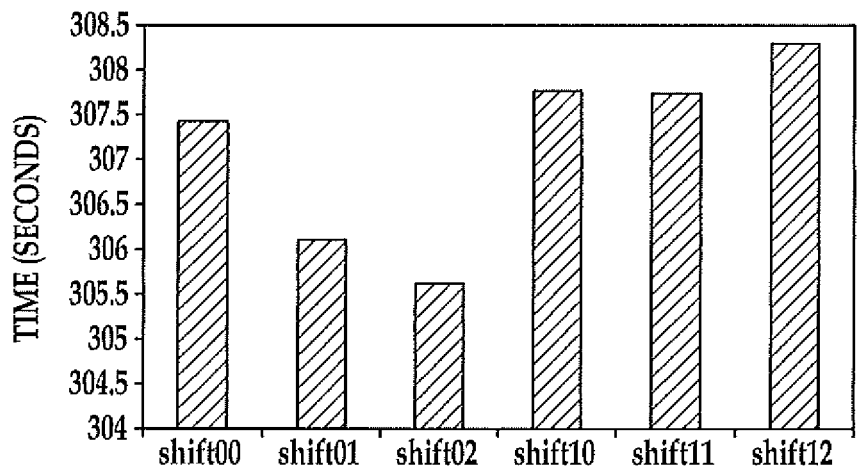
FIG. 10 is a graph illustrating the time for processing the repair data of FIG. 7 using a variety of layouts for alignment fields.

Each of FIGS. 5, 6 and 7 was analyzed with a default recipe including a default layout of the alignment fields as shown in FIG. 3 and with a variety of modifications to the default layout. The results of this analysis are shown respectively in FIGS. 8, 9 and 10, which graph repair time as compared to layouts. More specifically, FIG. 8 shows the times to repair the example of FIG. 5, FIG. 9 shows the time to repair the example of FIG. 6, and FIG. 10 shows the times to repair the example of FIG. 7. The various layouts of alignment fields are represented by shift00, shift01, etc., where the numbers after "shift" refer to the amount that the default layout of alignment fields is displaced in number of rows and columns. FIG. 4, for example, illustrates the layout represented by shift11 as it has one row and column displacement. As shown in FIG. 8, the example of FIG. 5 has its fastest processing with the alignment layout shifted one row and two columns (shift12) from that in the default recipe. As shown in FIG. 9, the example of FIG. 6 has its fastest processing with the alignment layout shifted zero rows and zero columns (shift00) from that in the default recipe. That is, the default recipe for the alignment layout is the fastest for the set of repair data represented by FIG. 6. Finally, as shown in FIG. 10, the example of FIG. 7 has its fastest processing with the alignment layout shifted zero rows and two columns (shift02) from that in the default recipe.

In these tests, the layout of alignment fields was modified, and the focus fields were modified to be coincident with the alignment fields. The total processing time for 20 wafers with various repair data, taken on the one hand with an optimal field layout for each wafer (that is, with wafer-specific recipes), was compared with the total processing time for those 20 wafers using the best single, constant field layout for all 20 wafers representing a default layout. Overall, the data suggests a possible improvement averaging 1-3 seconds per wafer, or about 1% of the processing time for the examples studied.

As mentioned previously, the state of the art is for the customer to specify these parameters and hold them constant for all wafers of the same design. FIGS. 8-10 show that no possible set of parameters can be optimal for all wafers. Allowing these parameters to vary according to the actual work to be performed or done for each wafer can optimize processing in a way that the results of processing do not suffer.

Figure 11:
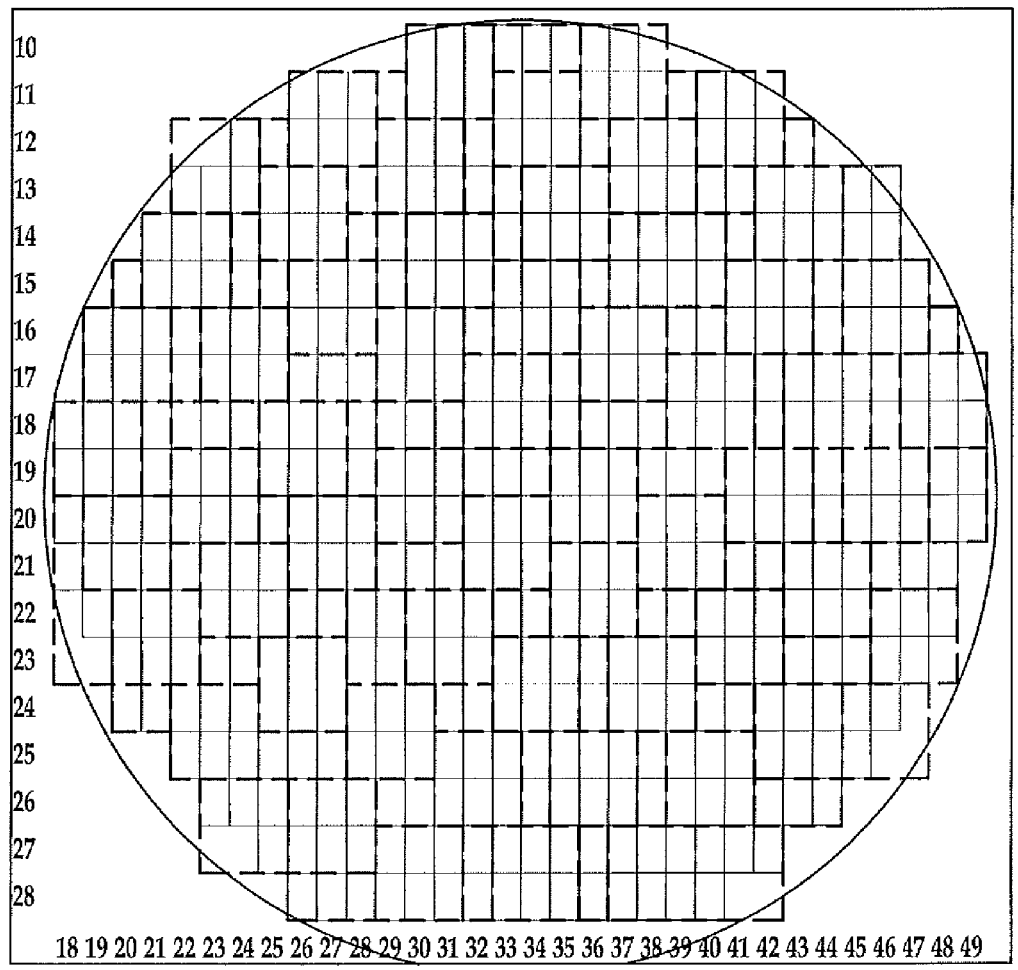
FIG. 11 is a plan view of an alternative layout of alignment fields in which the fields do not form a regular rectangular tiling pattern.

In this example, the alignment fields were varied in a rectangular tiling pattern across the whole wafer, shifted by one row or column each time, and evaluation of the results occurred using simulation. As mentioned previously, however, exhaustive simulations are not always needed or desirable. A hypothetical algorithm to select the layout of alignment fields need not consider all possible layouts in order to offer some benefit on a per-wafer basis compared to any one layout applied to all wafers. For example, FIG. 11 shows a pattern of alignment fields where the fields do not form a uniform rectangular tiling pattern. Such a pattern might be optimal for some cases where the work to be performed or done for a particular wafer is very sparse.

Another example of implementing the invention is directed to modifying processing fields based on the work to be performed on a wafer. A wafer is conventionally divided into processing fields. By definition, all work to be performed within a given processing field is completed before work on another field begins. The user may use one processing field for the entire wafer, or many processing fields can be included on a single wafer. The primary strategy used to define processing fields is to minimize the estimated time to complete the work in each processing field assuming the existence of a set of repair data where the maximum amount of work is performed in each die. For example, the user may divide the wafer into four processing fields of equal size. There may be cases where an actual wafer has only ¾ (or fewer) dies with work to be performed or cases where the actual work to be performed in each die is substantially less than the maximum. By taking the work to be performed into account, the wafer could be divided into fewer processing fields. Because certain work must be re-performed for each processing field, such as alignment, a reduction in processing fields reduces total processing time.

In addition, where there are multiple processing fields, the order in which the fields are processed is defined in the default recipe. As a result, the order will be the same for every wafer that is repaired. For example, a default recipe is defined to include a layout of 20 processing fields in the processing order shown in FIG. 12. By example, work to be performed on the wafer occurs only in the processing fields 3, 6, 10 and 14. As shown in FIG. 13, processing fields 1 and 2 have no work to be performed and can be skipped. Processing field 3 would have its work performed. Then, the system would skip 4 and 5 and proceed to processing field 6 to perform the work for that field. Processing fields 7, 8 and 9 would be skipped to reach processing field 10, then processing fields 11, 12 and 13 would be skipped to reach processing field 14. The remaining processing fields would be skipped.

A different ordering of the same work to be performed according to the teachings herein can be seen in FIG. 14. In this arrangement, a different order for processing is selected to minimize the back and forth motion from one region of the wafer to another given the knowledge of the work to be performed for the wafer. That is, the number of movements of the laser path across a centerline (i.e., a diameter) of the wafer is reduced. This wafer-specific recipe would result in less total time in moving through all processing fields with work to be performed as compared to that required by the default recipe shown in FIG. 13.

Another example of implementing the invention is directed to modifying reference fields in reference alignment based on the work to be performed on a wafer. This is illustrated in FIGS. 15 and 16. The process of determining the location of a wafer 240 on chuck 250 is critical to laser processing due to the tolerances described previously. This is a multi-step process that starts with video alignment. Video alignment, as is known to those skilled in the art, involves training one or machine targets and using machine vision algorithms to determine the location of those targets on a particular imaged product, in this example a wafer.

Reference alignment occurs after video alignment and is the final step in determining the location of this wafer on the process chuck. Generally, a reference field, reference focus and alignment targets used in this alignment are constant for all wafers in the default recipe. After reference alignment is complete, the system begins processing the work to be performed on a wafer by scanning targets for the focus and alignment fields required to execute link runs in the first processing field, and then in subsequent processing fields.

If one of the targets used for the reference field is the same physical target as used for a focus or alignment field, the system can re-use the scan results for that target when evaluating such focus or alignment field. For this reason, it is common to choose the targets for the reference alignment to be the same physical targets as used for nearby alignment fields. For example, in FIG. 15, the reference field 44 encompasses eight alignment fields. Any of the sixteen alignment fields (such as the six filled with dashes) that border one corner of reference field 44 could share a physical target with reference field 44. Note that it is customary for the physical alignment and focus targets to be located very near the corner of an alignment, focus or reference field. Further, three or four target locations are typical for each field.

However, if the work to be performed for a wafer does not contain any work in the alignment or focus fields that have a shared physical target with the reference field in this way, then the benefit of target sharing is not realized. In an embodiment of the invention, however, the location of reference field 44 could be changed. Equivalently, the selection of different physical alignment or focus targets to use for the reference field could occur. In this way, target sharing can occur. This is illustrated in FIG. 16 where reference field 44 of the default recipe is shown in dashed lines. In the wafer of FIG. 16, the only work to be performed is in the four (4) stippled alignment fields shown. By using an alternative reference field 46 in a wafer-specific recipe, all four of the physical targets used for reference alignment can be re-used by at least one of the alignment fields. Reference field 44 of the default recipe has only one physical target (i.e., the upper-right corner) that could be shared with any of the alignment fields containing the work to be performed, resulting in additional scanning versus using reference field 46 in the wafer-specific recipe.

Note that the above discussion monitors processing time as the processing result of a recipe and has emphasized the reduction in processing time that may be achieved through embodiments of the invention. It may also be possible to improve some other aspect of processing, e.g., the system accuracy, through these embodiments. System accuracy is a measurement, or calculation, resulting from an analysis of a processed part or parts as compared to expected results. There are a variety of procedures and algorithms known to those skilled in the art that can perform such a measurement.

Figure 17:
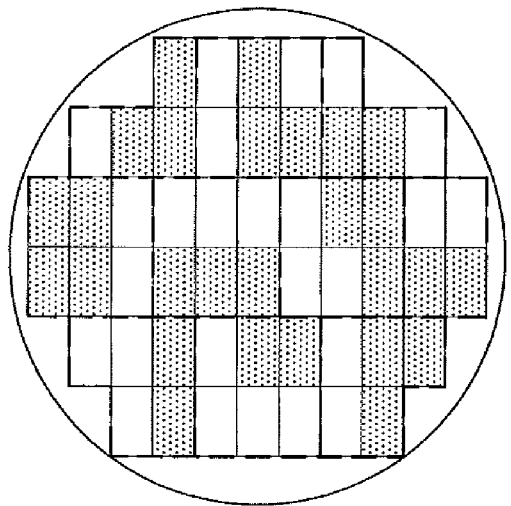
FIG. 17 is a plan view of a layout of alignment fields for one wafer including dies to repair.
Figure 18:
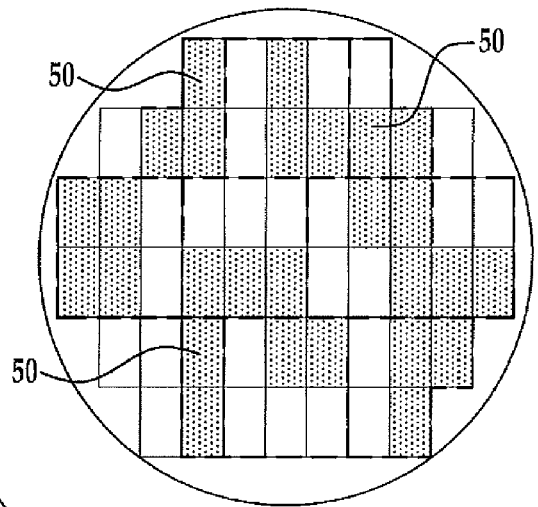
FIG. 18 is a plan view of an alternative layout of alignment fields for the one wafer of FIG. 17.
Figure 19:
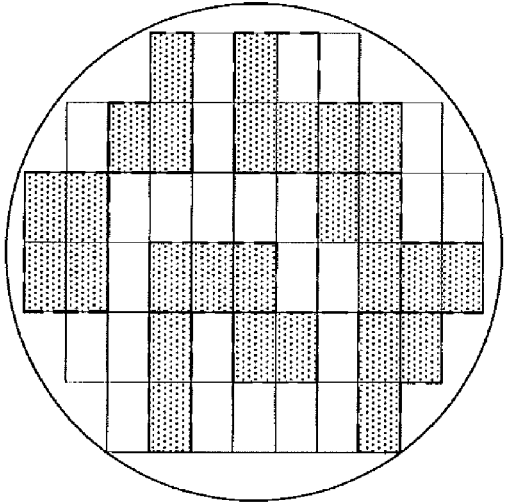
FIG. 19 is a plan view of an alternative layout of alignment fields for the one wafer of FIG. 17.

An example of implementing the invention to improve system accuracy is shown in FIGS. 17-19. Assuming that small alignment fields produce better system accuracy at the expense of system throughput, then automatically reducing the size of some alignment fields on a per-wafer basis in view of the work to be performed may maintain this higher accuracy without suffering as much throughput penalty. That is, while the processing result with the default recipe may result in acceptable accuracy and processing (throughput) time, the processing result with the altered recipe could be higher accuracy with a minimum effect on throughput time.

A possible layout of alignment fields is shown in FIG. 17 as a dashed line. As shown in FIG. 17, each alignment field contains at most six (6) die in a 2×3 pattern. For the wafer in this example, the stippled areas indicate locations having die to repair. FIG. 18 includes the same recipe except that three alignment fields 50 are reduced in size. While these three alignment fields 50 are reduced in size, they still surround the die needing repair. That is, an embodiment of the invention can reduce the size of alignment fields in areas where the sparseness of repair data means that the reduction in field size would not exclude any zones with work to be performed. The same number of alignment fields (ten) exist as in FIG. 17, and some die with no work to perform are not contained by any alignment field. Since the layout requires no additional scans, even though a few scans would be performed in different locations for the modified fields, the result is that die with work to perform are contained by smaller alignment fields, thereby improving system accuracy with little or no throughput penalty. FIG. 19 includes the same recipe as FIG. 17 except that all alignment fields have been reduced in size to minimally surround the die needing repair. The same number of alignment fields exists as in each of FIGS. 17 and 18, and some die with no work to perform are not contained by any alignment field. In this example, the reduced size of the alignment fields results in less sharing of alignment targets between neighboring fields. This results in improved system accuracy over the arrangement in FIG. 17, but at a small system throughput penalty due to less target sharing.

As mentioned briefly above, the parameters can also be modified to simulate the performance of a subset of a wafer. That is, since wafers are in practice repaired in sequence by processing fields, one could apply the teachings herein to the relevant portions of the default recipe that apply within the boundaries of the processing fields (i.e., the focus and alignment fields). This analysis could be completed in advance of the processing of the wafer in a manner similar to that described above or could be done for the next processing field simultaneous with processing of the current processing field. This latter case could provide benefits in the event analysis by simulation or otherwise cannot be completed for the entire wafer before beginning processing of the first processing field.

Where analyzing and modifying the default recipe is not done all at once before processing starts, one possible way to perform the processing is to first collect the repair data sufficient to start work in the first processing field. Optionally, the default recipe can be modified based on the repair data for the first processing field. Then, wafer 240 is placed on chuck 250 and alignment is performed before processing begins in the first processing field. During processing of the first processing field, repair data sufficient to define work in the second processing field is collected. The default recipe based on the repair data for the second processing field is modified to create an adjusted recipe for processing the second processing field. These steps would be repeated for all the processing fields in sequence.

In general, if the collection of data for a next processing area and the modification of the default recipe for a next processing area, if needed, can be completed before work is completed on the part in a current processing area, an embodiment results that achieves the benefits of modifying a default recipe even where the work to be performed is not fully available before processing of the part begins.

As described above, embodiments of the invention can alter the organization of the work to be performed but do not alter parameters that actually impact the results of processing, such as spot size, energy, etc. Moreover, the altered recipes are largely independent of changes in such parameters and in system parameters such as the hardware configuration. For at least these reasons, embodiments of this invention can be incorporated into other systems and methods for improving system throughput such as that described in US 2008/0314879 A1, assigned to the Assignee of the present invention and incorporated herein in its entirety by reference. In that disclosure, systems and methods to increase wafer throughput during laser-based processing are disclosed wherein parameters of a recipe file, such as the hardware configuration, etc., are altered without reference to the work to be performed.

An artisan will recognize that the systems and methods described herein may be applicable to link processing, trimming, drilling, routing, via drilling, scribing, marking, singulating, dicing, component trimming/tuning, and other material alternation processes, either performed with lasers, drills, other cutting tools, and/or directed energy techniques such as using a focused ion beam (FIB). Further, the systems and methods described herein may be useful for other devices besides processing tools. For example, the systems and methods described herein may be useful for metrology tools such as electron microscopes.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for processing a plurality of semiconductor parts in a laser-based system, comprising:
    A) analyzing work to be performed by a laser of the laser-based system to a part of the plurality of semiconductor parts using a default recipe to obtain a default processing result of processing the part by performing a computer simulation of the work using the default recipe and before processing the part, the default recipe including a common group of parameters for the laser-based system to process the plurality of semiconductor parts and wherein the work to be performed to the part is different from work to be performed for at least one remaining part of the plurality of semiconductor parts;
    B) modifying a parameter of the default recipe to create a part-specific recipe associated with the parameter, wherein the parameter affects an organization of the work to be performed to the part;
    C) analyzing the work to be performed by the laser to the part using the part-specific recipe to obtain an alternative processing result of processing the part by performing a computer simulation of the work using the part-specific recipe and before processing the part;
    D) selecting one of the default recipe and the part-specific recipe for processing the part based on which of the default processing result and the alternative processing result is closest to a desired processing result; and
    E) performing the work to be performed to the part using the selected recipe in the laser-based system.

2. The method according to claim 1, further comprising:
    performing A) to D) for each of the plurality of semiconductor parts and respective work to be performed to each of the plurality of semiconductor parts;
    combining selected recipes for each of the plurality of semiconductor parts into an altered recipe; and
    performing the respective work to be performed to each of the plurality of semiconductor parts using the altered recipe in the laser-based system.

3. The method according to claim 1, wherein the alternative processing result is a processing time for completing the work to be performed to the part using the part-specific recipe.

4. The method according to claim 1, wherein the plurality of parts includes a plurality of semiconductor wafers, the part is a semiconductor wafer; and wherein modifying the parameter of the default recipe comprises changing an angle of placement of the wafer in a wafer support of the laser-based system.

5. The method according to claim 1, wherein the plurality of parts includes a plurality of semiconductor wafers, the part is a semiconductor wafer, and the work to be performed by the laser comprises repair data for memory located on the semiconductor wafer.

6. The method according to claim 5, wherein the default recipe comprises a default layout for alignment fields that align the laser to the semiconductor wafer in a first direction and a second direction orthogonal to the first direction; and wherein modifying the parameter of the default recipe to create the part-specific recipe comprises adjusting the default layout for the alignment fields in at least one of the first direction and the second direction to form a modified layout for the alignment fields in the part-specific recipe.

7. The method according to claim 6, wherein the default layout for the alignment fields comprises a rectangular tiling pattern across a surface of the semiconductor wafer; and wherein adjusting the default layout for the alignment fields comprises shifting the rectangular tiling pattern by at least one of a column and a row to form the modified layout in the part-specific recipe.

8. The method according to claim 5, wherein the default recipe comprises processing fields that define field sizes for processing link runs for memory repair of the semiconductor wafer; and wherein modifying the parameter of the default recipe to create the part-specific recipe comprises reducing a number of the processing fields for the semiconductor wafer from that in the default recipe based on the work to be performed for the wafer.

9. The method according to claim 5, wherein the default recipe comprises processing fields that define field sizes for processing link runs for memory repair of the semiconductor wafer; and wherein modifying the parameter of the default recipe to create the part-specific recipe comprises changing an order of processing the processing fields for the semiconductor wafer from that in the default recipe based on the work to be performed to the wafer.

10. The method according to claim 9, wherein changing the order of processing the processing fields for the semiconductor wafer from that in the default recipe comprises reducing a number of movements of a laser path across a diameter of the wafer based on the work to be performed to the wafer.

11. The method according to claim 1, wherein modifying the parameter of the default recipe to create the part-specific recipe associated with the parameter comprises modifying the parameter a plurality of times to create a plurality of part-specific recipes associated with each respective modification of the parameter; wherein analyzing the work to be performed by the laser to the part using the part-specific recipe comprises analyzing the work to be performed by the laser to the part using each of the plurality of part-specific recipes to obtain a respective alternative processing result associated with each of the plurality of part-specific recipes; and wherein selecting one of the default recipe and the part-specific recipe for processing the part comprises selecting the default recipe or one of the plurality of part-specific recipes based on whether the default processing result or the respective alternative processing result associated with the one of the plurality of part-specific recipes comprises a faster processing time for the part.

12. The method according to claim 1 wherein the default recipe comprises a reference field used to align the part in a part supporting structure of the laser-based system, the reference field including a target location; and wherein modifying the parameter of the default recipe to create the part-specific recipe comprises adjusting at least one of a size and a location of the reference field from that in the default recipe so that the target location defines a shared physical target with at least one of an alignment field that aligns the laser to the part in a first direction and a second direction orthogonal to the first direction and a focus field that aligns the laser to the part in a third direction orthogonal to the first direction and the second direction, the adjusting based on the work to be performed on the part.

13. The method according to claim 1 wherein the default processing result is a processing time for completing the work to be performed to the part using the default recipe and the alternative processing result is a processing time for completing the work to be performed to the part using the part-specific recipe; and wherein selecting one of the default recipe and the part-specific recipe for processing the part based on which of the default processing result and the alternative processing result is closest to the desired processing result comprises selecting the default recipe when the default processing result is less than the alternative processing result and selecting the part-specific recipe when the alternative processing result is less than the default processing result.

14. An apparatus for processing a plurality of semiconductor parts in a laser-based system, comprising:
   A) means for analyzing work to be performed by a laser of the laser-based system to a part of the plurality of semiconductor parts using a default recipe to obtain a default processing result of processing the part by performing a computer simulation of the work using the default recipe and before processing the part, the default recipe including a common group of parameters for processing the plurality of semiconductor parts and wherein the work to be performed to the part is different from work to be performed for at least one remaining part of the plurality of semiconductor parts;
   B) means for modifying a parameter of the default recipe to create a part-specific recipe associated with the parameter, wherein the parameter affects an organization of the work to be performed to the part;
   C) means for analyzing the work to be performed by the laser-based system to the part using the part-specific recipe to obtain an alternative processing result of processing the part by performing a computer simulation of the work using the part-specific recipe and before processing the part; and
   D) means for selecting one of the default recipe and the part-specific recipe for processing the part based on which of the default processing result and the alternative processing result is closest to a desired processing result; and wherein
   the laser-based system is configured to perform the work to be performed to the part using the selected recipe.

15. The apparatus according to claim 14, wherein the plurality of parts includes a plurality of semiconductor wafers, the part is a semiconductor wafer, and the work to be performed by the laser comprises repair data for memory located on the semiconductor wafer.

* * * * *